United States Patent [19]

Hawrylo

[11] Patent Number: 4,832,251
[45] Date of Patent: May 23, 1989

[54] METHOD OF MOUNTING SEMICONDUCTOR LASERS PROVIDING IMPROVED LASING SPOT ALIGNMENT

[75] Inventor: Frank Z. Hawrylo, Trenton, N.J.

[73] Assignee: General Electric Company, Schenectady, N.Y.

[21] Appl. No.: 560,799

[22] Filed: Dec. 13, 1983

[51] Int. Cl.<sup>4</sup> .......................... H01S 3/02; B23K 1/00
[52] U.S. Cl. ........................ 228/105; 445/4; 437/8; 356/399
[58] Field of Search .................. 228/180 A, 122, 123, 228/103, 105, 56.5; 356/399; 372/36; 29/569 L, 589; 445/4, 28

[56] References Cited

U.S. PATENT DOCUMENTS

| | | |
|---|---|---|
| 3,479,716 | 11/1969 | Zanger, Jr. et al. . |
| 3,696,985 | 10/1972 | Herring .......................... 29/589 |
| 3,938,895 | 2/1976 | Bridger et al. . |
| 4,184,741 | 1/1980 | Hawk et al. . |
| 4,223,227 | 9/1980 | Horwitz ......................... 356/399 |
| 4,237,474 | 12/1980 | Ladany . |
| 4,389,557 | 6/1983 | Devenyi et al. ................. 228/123 |
| 4,488,304 | 12/1984 | Shimizu .......................... 322/36 |
| 4,548,466 | 10/1985 | Evans ............................. 372/36 |

FOREIGN PATENT DOCUMENTS 2052140  1/1981  United Kingdom ................. 372/36

Primary Examiner—Kenneth J. Ramsey
Attorney, Agent, or Firm—William Squire; James C. Davis, Jr.; Paul R. Webb, II

[57] ABSTRACT

An improved method of mounting electroluminescent semiconductor laser devices onto heatsinks, wherein easy subsequent location of the lasing spot of the laser is provided, is disclosed. The method comprises placing a reference mark on the front of the heatsink, wetting solder to the heatsink and allowing it to harden, contacting the laser device to the hardened solder, applying current to the laser device to cause light emission, aligning the lasing spot to the reference mark and bonding the laser device to the heatsink while maintaining such alignment.

3 Claims, 1 Drawing Sheet

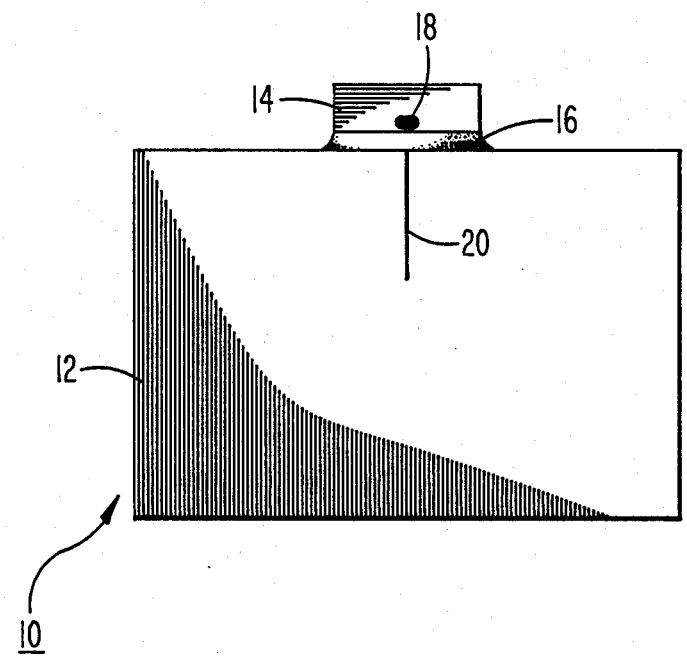

METHOD OF MOUNTING SEMICONDUCTOR LASERS PROVIDING IMPROVED LASING SPOT ALIGNMENT

The Government has rights in this invention pursuant to a Government Contract.

BACKGROUND OF THE INVENTION

Electroluminescent semiconductor devices, such as lasers, are presently used in a variety of communications, recording, and detection systems. In each application, it is important that the light emitted from the device be accurately aligned with, or coupled into, other components of the system, such as an optical fiber. A primary limitation on the effectiveness of such a system is the coupling efficiency, i.e., the amount of light emitted by the electroluminescent device compared to the amount of light which is detected at the other end of the fiber.

An important parameter for coupling is consideration of the dimensions involved. For instance, the emitting facet of a typical laser device is about 250 microns in width, but the "lasing spot" (the location on the facet from which the light actually is emitted) for a multimode laser device is only about 10 microns in width. The same 250 micron wide facet of a single mode laser has a lasing spot only 2 to 3 microns in width. The light from the "lasing spots" must be coupled into a 50 micron or an 8 to 10 micron diameter fiber core respectively. Thus, in the assembly of an optical communications system, misalignment of the laser device by only several microns becomes a problem. Therefore in connecting a laser device into a system, it is important to know the location of the lasing spot on the facet exactly. This is not always easy. For instance, many lasers include a stripe contact. This, to some extent, dictates where the light emission will occur, but the light emission may occur several microns to one side or the other of the stripe contact. Further, when laser devices are mounted "striped side down" onto a copper heatsink, the exact location of the stripe is not known.

It would be desirable, therefore, to develop a method of mounting laser devices onto heatsinks such that in subsequent connection of these devices into systems, the lasing spot on the emitting facet can be readily located to provide efficient alignment of the device with respect to other components of the system.

SUMMARY OF THE INVENTION

An improved method of mounting electroluminescent semiconductor laser devices onto heatsinks, to provide easy location of the lasing spot is provided. The method comprises placing a reference mark on the front of the heatsink, wetting solder to the heatsink and allowing it to solidify, contacting the laser device to the solidified solder, applying current to the laser device to cause light emission, aligning the laser spot with the reference mark and bonding the laser device to the heatsink to maintain such alignment.

BRIEF DESCRIPTION OF THE DRAWING

The FIGURE illustrates a laser device which has been mounted in accordance with the present invention.

DETAILED DESCRIPTION OF THE INVENTION

The FIGURE shows a mounted laser device generally as 10, mounted in accordance with the method of the present invention. The mounted laser device 10 comprises a heatsink 12 which is typically a metallized copper block several orders of magnitude larger than the laser diode 14, which is affixed thereto with a solder layer 16. The laser diode 14 is likewise several orders of magnitude larger than the lasing spot 18.

It can be seen that slight misalignment of the mounted laser device 10 in a larger system (not shown) such as an optical recording or optical communications system, or a slight misalignment of the laser diode 14 on the heatsink 12, can cause a proportionately large shift in position of the lasing spot 18. It becomes apparent that in assembling the mounted laser device 10, it is important for the worker to know the location of the lasing spot 18. For high volume production, it is also important that the lasing spot 18 be in substantially the same location with respect to the heatsink 12 for each mounted laser device 10. By mounting the laser diode 14 in accordance with the present invention, which employs a reference mark 20 on the front of the heatsink 12 of each mounted laser device 10, the above goals can be realized.

Although the concept of the present invention can be applied to any device mounting means known in the art, it is convenient to employ the present method when mounting lasers using a diode bonding machine.

A reference mark to which the lasing spot can be aligned is placed on the front of the heatsink. As a practical matter when designing a system into which the mounted laser device will be incorporated, one should predetermine where the lasing spot is desired. After this determination is made all heatsinks can be marked during their manufacture. The marked heatsink is placed onto the movable heating stage, or workstage, of a diode bonding machine. Solder, of any of the types known in the device bonding art, is applied to the mounting surface of the heatsink. The workstage is activated to heat the solder to an appropriate temperature to cause the solder to flow and then the solder is allowed to solidify. A vacuum chuck, or collet, picks up the laser diode and places it on the heatsink in contact with the solidified solder. A current sufficient to initiate lasing of the diode is supplied by any convenient means. For example, in many diode bonding machines the workstage is electrically grounded. If the collet is electrically isolated from the rest of the diode bonding machine, a clip lead from a power supply can be attached to the collet, thereby allowing an appropriate current to be provided to the diode in order for lasing to occur.

A trinocular microscope with a TV camera and monitor can be employed to observe the lasing spot. As a practical matter, the TV camera should be sensitive to the wavelength of the light emitted from the laser diode.

When the laser diode and reference mark are properly focused in the viewing means, the current is supplied to the laser diode until the lasing spot appears. The lasing spot is accurately aligned with the reference mark on the heatsink by moving the workstage holding the heatsink. After alignment, the current supply is shut off and the appropriate temperature and/or pressure is applied to the diode, heatsink and solder to bond them together while maintaining the alignment.

After bonding, but prior to removal of the mounted device from the diode bonding machine, the current can be turned back on to verify the alignment. If necessary, the position of the laser diode can be readjusted by reheating the solder, or the position can be recorded photographically so as to document the amount of lasing spot-to-reference mark misalignment.

This relatively straightforward mounting method obviates the need for elaborate photodetectors used in some alignment methods and can be practiced on most existing diode bonding machines with a minimal amount of alterations. Also, diodes which do not lase or are of undesirable quality, can be rejected prior to mounting.

The present invention will now be described in the following example. It should be understood that the invention is not meant to be limited to the details described therein.

EXAMPLE I

A reference mark was put on the front surface of a 2.3 mm × 3.2 mm × 11.4 mm metallized copper heatsink of the type used in mounting laser devices. The heatsink was placed on a movable workstage of a Kulicke and Soffa Model 648 Diode Bonding Machine. Gold-tin eutectic solder was placed above the reference mark on the mounting surface of the heatsink. The workstage was heated to about 300° C. until the solder flowed. The heat was turned off until the solder solidified. Using the vacuum collet of the diode bonder, a 100 μm × 165 μm × 250 μm, 900 nanometer wavelength, infra-red semiconductor laser diode was placed in contact with the solidified gold-tin solder. Effective viewing of the laser diode was provided by equipping the diode bonder with a Bausch and Lomb Stereo Zoom 7 trinocular microscope and an RCA 2000 TV Camera (sensitive to infra-red) and TV monitor. The workstage of the diode bonder was grounded and the collet was electrically insulated from the rest of the diode bonder so that a wire lead from a power supply could be attached to the collet to provide current to the diode. When the diode and heatsink were properly focused in the TV monitor, a pulsed current was applied to the laser diode until lasing occurred. By manipulating the workstage holding the heatsink, the heatsink was moved until the reference mark was aligned with the lasing spot on the facet of the laser diode. The pulsed current was shut off and the workstage was again heated to 300° C. Using a pressure of about 100 grams for 10 seconds, the laser diode was bonded to the heatsink.

I claim:

1. A method of mounting a semiconductor laser device to a heatsink comprises;
    (a) providing a reference mark on the heatsink corresponding to the desired location of a lasing spot;
    (b) placing the marked heatsink on a heating stage;
    (c) applying solder to the heatsink and wetting the solder to the heatsink by activating the heating stage to an appropriate temperature;
    (d) allowing the solder to solidify;
    (e) placing the laser device on the solidified solder;
    (f) applying current to the device sufficient to cause lasing;
    (g) aligning the lasing spot of the laser device with the reference mark on the heatsink; and,
    (h) bonding the laser device to the heatsink while maintaining the alignment.

2. The method of claim 1 wherein after the bonding of step (h), the alignment is rechecked and if misalignment is found, the solder is reliquified and steps (f), (g), and (h) are repeated.

3. The method of claim 1 wherein step (g) is accomplished through the use of magnification into a television camera and monitor, which camera is sensitive to the wavelength of light emitted by the laser device.

* * * * *